(12) United States Patent
Porter et al.

(10) Patent No.: US 12,073,120 B2
(45) Date of Patent: Aug. 27, 2024

(54) ACTIVATE INFORMATION ON PRECEDING COMMAND

(71) Applicant: Micron Technology, Inc., Boise, ID (US)

(72) Inventors: John David Porter, Boise, ID (US); Bryan David Kerstetter, Kuna, ID (US); Kwang-Ho Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/965,584

(22) Filed: Oct. 13, 2022

(65) Prior Publication Data
US 2024/0126476 A1 Apr. 18, 2024

(51) Int. Cl.
*G06F 3/06* (2006.01)
(52) U.S. Cl.
CPC .......... *G06F 3/0659* (2013.01); *G06F 3/061* (2013.01); *G06F 3/0673* (2013.01)
(58) Field of Classification Search
CPC .......... G06F 3/06; G06F 3/061; G06F 3/0673; G06F 3/0659
See application file for complete search history.

(56) References Cited

U.S. PATENT DOCUMENTS

| | | | | |
|---|---|---|---|---|
| 10,162,406 | B1 * | 12/2018 | Mazumder | G06F 3/002 |
| 10,424,367 | B2 | 9/2019 | Matsuno et al. | |
| 11,631,442 | B1 * | 4/2023 | Cho | G11C 7/222 |
| | | | | 365/230.06 |
| 2003/0198119 | A1 * | 10/2003 | Jones, Jr. | G11C 7/1042 |
| | | | | 365/230.03 |
| 2006/0140044 | A1 * | 6/2006 | Kang | G11C 7/1072 |
| | | | | 365/210.1 |
| 2014/0006886 | A1 * | 1/2014 | Song | G11C 29/14 |
| | | | | 714/718 |
| 2016/0098194 | A1 * | 4/2016 | Garrett, Jr. | G11C 7/1042 |
| | | | | 711/105 |
| 2018/0342286 | A1 * | 11/2018 | Richter | G11C 11/4094 |
| 2019/0066758 | A1 * | 2/2019 | Gajapathy | G11C 7/1093 |

FOREIGN PATENT DOCUMENTS

| | | | | |
|---|---|---|---|---|
| WO | WO-2017048441 A1 * | 3/2017 | | G06F 13/1636 |
| WO | WO-2018216081 A1 * | 12/2018 | | G06F 12/00 |

OTHER PUBLICATIONS

N. P. Jouppi, A. B. Kahng, N. Muralimanohar and V. Srinivas, "CACTI-IO: CACTI With OFF-Chip Power-Area-Timing Models," in IEEE Transactions on Very Large Scale Integration (VLSI) Systems, vol. 23, No. 7, pp. 1254-1267, Jul. 2015.*
U.S. Appl. No. 17/556,619, filed Dec. 20, 2021, Cho.

* cited by examiner

*Primary Examiner* — Pierre Michel Bataille
(74) *Attorney, Agent, or Firm* — Fletcher Yoder, P.C.

(57) ABSTRACT

A method and a device is provided for utilizing unused valid (V) bits residing on a previous command to transmit additional activate information to a memory device. Additional activate information may be transmitted to the memory device without increasing the tRCD time, or increasing the command/address (CA) bus pins, or adding additional circuit area, thereby reducing the impact on the performance of the memory device.

21 Claims, 8 Drawing Sheets

EXISTING RB4M COLUMN COMMANDS

| COMMAND | MODE (BG/64B) | SDR CMD PIN CS | COMMAND BUS / DDR COMMAND PLUS ||||||| CK EDGE |
|---|---|---|---|---|---|---|---|---|---|
| | | | CMD0 CA0 | CMD1 CA1 | CMD2 CA2 | CMD3 CA3 | CMD4 CA4 | CMD5 CA5 | CMD6 CA6 | |
| WRITE (WR16) | ANY | H | L | H | H | C0 | V | V | BA3 | R1 |
| | | X | BA0 | BA1 | BG0 BA4 | BG1 BA5 | C1 | BA2 | AP | F1 |
| WRITE32 (WR32) | BG | H | L | L | H | L | V | V | BA3 | R1 |
| | 64B | X | BA0 | BA1 | BG0 BA4 | BG1 BA5 | C1 | BA2 | AP | F1 |
| MASK WRITE (MWR) | ANY | H | L | L | L | C0 | V | V | BA3 | R1 |
| | BG | X | BA0 | BA1 | BG0 BA4 | BG1 BA5 | C1 | BA2 | AP | F1 |
| READ (RD16) | ANY | H | H | L | H | C0 | V | V | BA3 | R1 |
| | BG | X | BA0 | BA1 | BG0 BA4 | BG1 BA5 | C1 | BA2 | AP | F1 |
| READ32 (RD32) | ANY | H | H | L | L | C0 | V | V | BA3 | R1 |
| | 64B | X | BA0 | BA1 | BG0 BA4 | BG1 BA5 | C1 | BA2 | AP | F1 |

FIG. 3

| COMMAND | MODE (BG / 64B) | SDR CMD PIN | COMMAND BUS / DDR COMMAND PLUS | | | | | | | |
|---|---|---|---|---|---|---|---|---|---|---|
| | | CS | CMD0 CA0 | CMD1 CA1 | CMD2 CA2 | CMD3 CA3 | CMD4 CA4 | CMD5 CA5 | CMD6 CA6 | CK EDGE |
| ACT-1 (ACTIVATE-1) | ANY | H | H | H | H | R12 | R13 | R14 | R15 | R1 |
| | BG | X | BA0 | BA1 | BG0 | BG1 | R11 | BA3 | BA2 | F1 |
| | 64B | | | | BA4 | BA5 | | | | |
| ACT-2 (ACTIVATE-2) | ANY | H | H | H | L | R7 | R8 | R9 | R10 | R1 |
| | | X | R0 | R1 | R2 | R3 | R4 | R5 | R6 | F1 |

← 320

ACTIVATE INFORMATION ON PRECEDING COMMAND

BACKGROUND OF THE INVENTION

Field of the Invention

The present invention relates generally to the field of memory devices. More specifically, embodiments of the present disclosure relate to providing memory commands for accessing, sensing, and other operations for memory cells.

Description of the Related Art

Memory devices are widely used to store information related to various electronic devices such as computers, wireless communication devices, cameras, digital displays, and the like. Memory devices are frequently provided as internal memory, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, may retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others.

A memory device may include a number of storage elements, such as memory cells. Memory cells of a binary memory device may, for example, include a charged or discharged capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline/digit line. Different memory devices may use different architectures for arranging the memory cells. For example, different memory devices may arrange the memory cells in 2-dimensional or 3-dimensional rows and columns. A memory cell may be accessed based on activating a row and a column of the memory device corresponding to the memory cell.

Improving memory devices, generally, may include increasing memory cell density, increasing read/write speeds or otherwise reducing operational latency, increasing reliability, increasing data retention, reducing power consumption, or reducing manufacturing costs, among other metrics. Emerging memory technologies may require greater activation power. To reduce power associated with activation, page sizes may be decreased, which may result in greater row address terms and less column terms. Further, increased density may require more row address terms. Moreover, to provide flexibility to controllers in memory devices, a dynamic page size activation feature may be provided allowing multiple page sizes (e.g., 64 B or 128 B) to be activated, which may require extra activate information. Additional row address and dynamic page size information may be transmitted with the activate (ACT) command, but the available DRAM ACT command address tables (e.g., generated for 7-pin command/address interface) may not accommodate transmission of the additional activate information. Additional command/address (CA) bus pins may be used to transmit additional activate information to the memory device, however, the physical compatibility may be reduced. The number of clock cycles that constitute an ACT command may also be increased to transmit additional activate information to the memory device, however, the system performance may be reduced. Further, the transmission of additional activate information on a subsequent column command may require additional circuit area and heavily modified specifications. Accordingly, it is desirable to allow additional activate information to be transmitted to the memory device without requiring additional command/address (CA) bus pins, increasing activate cycle count, or impacting die size.

BRIEF DESCRIPTION OF THE DRAWINGS

Various aspects of this disclosure may better be understood upon reading the following detailed description and upon reference to the drawings in which:

FIG. 3 is a truth table for column commands for a memory device, according to an embodiment of the present disclosure;

DETAILED DESCRIPTION OF SPECIFIC EMBODIMENTS

Figure 1:
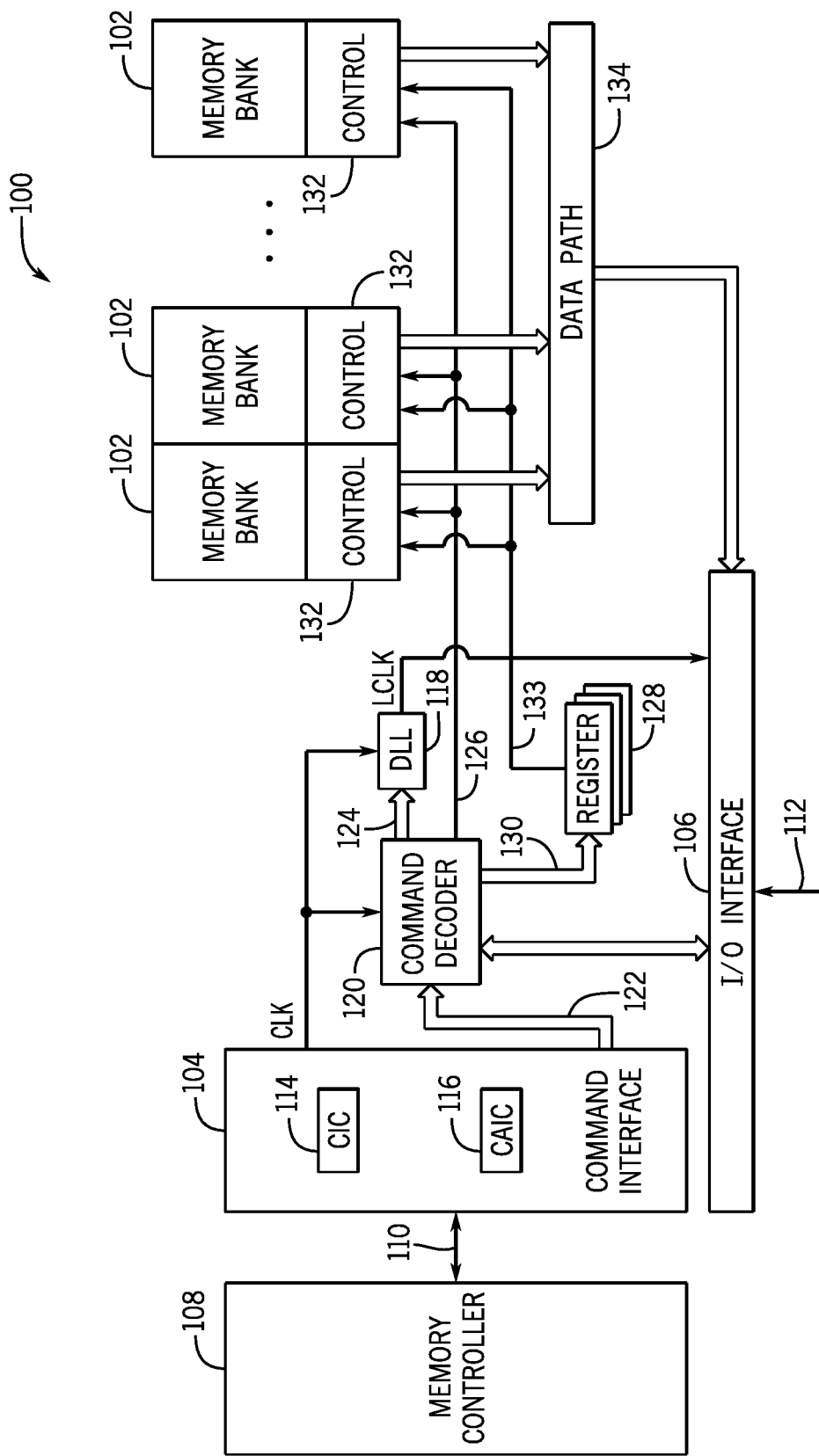
FIG. 1 is a block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A memory device may perform memory operations such as storing data and retrieving stored data. For example, a computing system may include various system components including one or multiple memory devices. The system components may communicate data (e.g., data bits) to perform system operations. For example, the system may include one or more processing components, one or more memory devices, among other system components. In different embodiments, the computing system may be disposed on a single electronic chip or multiple electronic chips. Moreover, the computing system may be disposed on a single electronic device or multiple electronic devices positioned in proximity of or remote from each other.

In any case, the memory device may include multiple memory components for storing data and retrieving stored data based on receiving access commands (e.g., memory access requests) from various system components (e.g., a processor). For example, the processor may transmit the access commands using a number of data bits. In different embodiments, the processor may transmit the access commands using different communication protocols (e.g., memory command protocols under JEDEC standard). For example, the processor may use a memory command protocol based on a number of communication pins (hereinafter, pins) of the memory device. The memory device may receive a number of data bits corresponding to a number of pins of the memory device at each rising or falling edge of a clock signal.

The memory device may include a number of memory banks, controller circuitry, command decoder circuitry, and a clock circuit to provide the clock signal, among other memory components. In some cases, the controller circuitry (hereinafter, controller) may include the command decoder circuitry (hereinafter, command decoder). In alternative or additional cases, the command decoder may include separate circuitry disposed between the controller and the memory banks or any other viable location. Moreover, the memory components may include an input/output interface for communication with other system components. For example, the input/output interface of some memory components may include the pins for receiving the access commands from the processor.

In different embodiments, the memory device may include a different number of memory banks (e.g., 2 memory banks, 4 memory banks, 8 memory banks, etc.). Each memory bank may include a number of memory cells arranged in rows and columns. Moreover, in different cases, a memory bank may include a different number of rows and/or columns of the memory cells (e.g., 16 rows, 18 rows, 22 rows, 26 rows, etc.).

In any case, the command decoder may include circuitry to receive the access commands and provide the access instructions to the memory banks, as will be appreciated. The command decoder may facilitate accessing target memory cells by providing the access instructions. The access commands may include requests to perform memory operations including memory read operations and memory write operations on the target memory cells. In some cases, the processor of the computing system may transmit the access commands to the memory device. In different cases, any other viable processing circuitry may transmit the access commands to the memory device.

As mentioned above, the processor may transmit the access commands to the memory device using a memory command protocol. Moreover, the memory command protocol is determined, at least in part, based on a number of pins of the memory device. For example, at each rising or falling edge of the clock signal, the command decoder may receive a number of data bits of the access commands corresponding to the number of pins. Subsequently, the command decoder may provide the access instructions to activate respective rows and columns of the target memory cells for accessing (e.g., reading from and/or writing to) the target memory cells.

With the foregoing in mind, in different embodiments, the access commands may include a different length or include a different number of data bits. In some cases, each access command may include a header followed by a number of address bits associated with the target memory cells. For example, the header may have a unique combination of logic values for identifying a command type, e.g., an "ACT" command for transmitting activate information of a target memory cell, a "READ" command for a read operation of data from a target memory cell, or a "WRITE" command for a write operation of data to a target memory cell. Moreover, the address bits may include address information of the target memory cells indicating the rows, columns, and/or memory banks of the target memory cells.

In some embodiment, the memory device may access a set of target memory cells in one memory cycle, which may correspond to one or multiple clock cycles. In the one memory cycle, the memory device may receive a set of address bits indicative of the set of target memory cells. In different embodiments, the memory device may receive the set of address bits using one or multiple access commands, as will be appreciated. The set of address bits may include a number of data bits corresponding to a number of rows, columns, and/or memory banks of the memory cells in the memory device. For example, in one memory cycle, the set of address bits may include one address bit per row of memory cells of the memory device for indicating the set of target memory cells.

In some embodiments, a memory cycle may include multiple access commands, each including a respective command header and a portion of the set of address bits, to indicate the address information of the target memory cells. Each access command in the memory cycle may include a portion of the set of address bits for accessing the target memory cells. In some embodiments, the memory device may receive each access command using a single clock cycle. For example, each clock cycle may correspond to a rising edge and/or a falling edge of the clock signal. In alternative or additional embodiments, the processor may transmit the access commands using a multi-clock cycle memory command protocol. In such embodiments, the processor may transmit an access command including the set of address bits using multiple clock cycles. For example, the processor may provide the header and a portion of the set of address bits in a first clock cycle, then a remaining portion of the set of address bits may be provided in a second clock cycle. In some cases, the access command may provide the remaining portion of the set of address bits using multiple clock cycles (e.g., second clock cycle, third clock cycle, fourth clock cycle, etc.). In such embodiments, the processor may provide one header followed by a number of address bits using multiple clock cycles. The command decoder of the memory device may decode each access command after receiving it. The command decoder may provide the access instructions to the memory banks based on the received access commands.

As mentioned above, the number of address bits may correspond to the number of rows, columns, and/or memory banks of the memory device. In some cases, each address bit may correspond to a respective row and/or memory bank of the memory device. The number of pins of the memory device may correspond to a number of data bits the command decoder of the memory device may receive in each clock cycle. As discussed above, increasing memory cell density and/or reducing page size may require more row address terms. Moreover, to provide flexibility to controllers in memory devices, a dynamic page size activation feature may be provided allowing multiple page sizes (e.g., 64 B or 128 B) to be activated, which may require extra activate information. Additional row address and dynamic page size information should be transmitted with the activate (ACT) command, and the available DRAM ACT command address tables (e.g., generated for 7-pin command/address interface) do not accommodate enough information without implementing solutions that may greatly impact the performance of the memory devices, such as increasing the command/address (CA) bus pins, increasing the number of clock cycles that constitute an ACT command, or adding additional circuit area. Accordingly, it is desirable to allow additional activate information to be transmitted to the memory device with reduced or negligible impact on the performance of the memory device.

The current disclosure herein provides a technology and methods related to utilizing unused valid (V) bits residing on a previous command to transmit additional activate information to a memory device for a subsequent activate command (ACT). Additional activate information may be transmitted to the memory device without increasing the tRCD (i.e., minimum number of clock cycles required to issue a READ or WRITE command after the ACT command) time, increasing the command/address (CA) bus pins, or adding additional circuit area, thereby reducing the impact on the performance of the memory device.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each including one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK. In some cases, the command decoder 120 may receive the access commands using a rising edge and/or a falling edge of the external clock signal. For example, a processor may transmit the access commands using a memory command protocol, such as a single clock cycle memory command protocol, or a multi-clock cycle memory command protocol. The processor may use a specific memory command protocol (as illustrated in FIG. 3) based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various memory devices to provide and/or define operations of various components of the memory device 100. The one or more registers 128 may communicate with the control blocks 132 via a bus path 133.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the memory device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over a data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
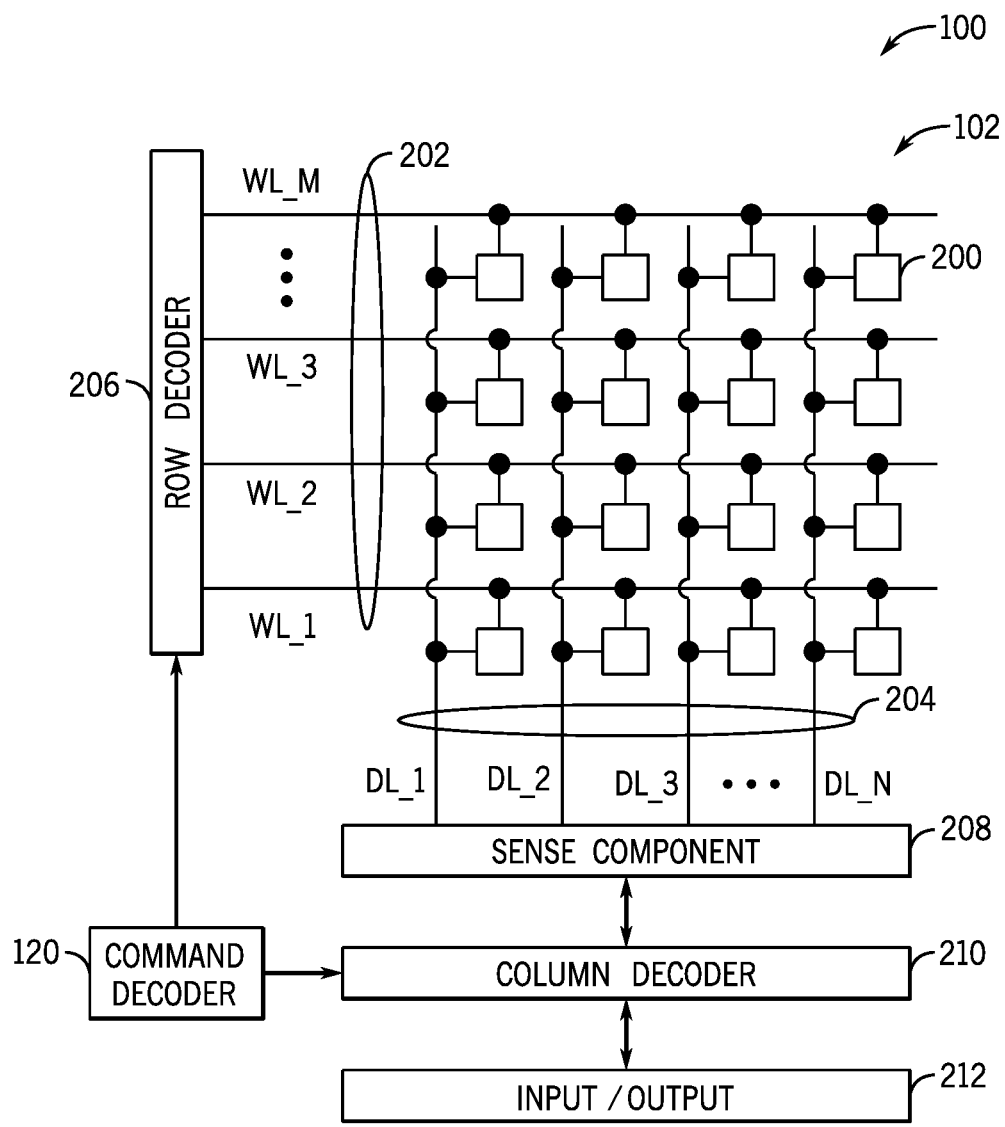
FIG. 2 illustrates a memory bank of the memory device of FIG. 1, according to an embodiment of the present disclosure.

Referring now to FIG. 2, a memory bank 102 of the memory device 100 is illustrated in accordance with various examples of the present disclosure. The memory bank 102 may include a number of memory cells 200 that are programmable to store different memory states. In the depicted embodiment, the memory cells 200 may be arranged in multiple rows (e.g., 22 rows, 19 rows, etc.) and multiple columns.

Memory operations, such as reading and writing memory states, may be performed on the memory cells 200 by activating or selecting the appropriate word lines 202 and digit lines 204. Activating or selecting a word line 202 or a digit line 204 may include applying a voltage to the respective lines. The word lines 202 and the digit lines 204 may include conductive materials.

For example, word lines 202 and digit lines 204 may be made of metals (such as copper, aluminum, gold, tungsten, etc.), metal alloys, other conductive materials, or the like. In the depicted embodiment, each row of the memory cells 200 is connected to a single word line 202, and each column of the memory cells 200 is connected to a single digit line 204. Moreover, each of the memory cells 200 may be associated with a row and a column of the memory bank 102. Accordingly, each of the memory cells 200 is connected to a respective word line 202 and a respective digit line 204.

By applying a voltage to a single word line 202 and a single digit line 204, a single memory cell 200 may be activated (or accessed) at their intersection. Accessing the memory cell 200 may include performing reading or writing operation on the memory cell 200. For example, a read operation may include sensing a charge level from the memory cell 200. The intersection of a word line 202 and digit line 204 may be referred to as an address of a respective memory cell 200. Accordingly, the command decoder 120 may provide the access instructions, including the address bits, to indicate the word lines 202 and digit lines 204 corresponding to the target memory cells 200.

In some architectures, the memory state storage of the memory cell 200 (e.g., a capacitor) may be electrically isolated from the digit line by a selection component. The word line 202 may be connected to and may control the selection component. For example, the selection component may be a transistor and the word line 202 may be connected to the gate of the transistor. Activating the word line 202 may result in an electrical connection or closed circuit between the capacitor of the memory cell 200 and its corresponding digit line 204. The digit line 204 may then be activated to either read or write the memory cell 200.

Accordingly, accessing the memory cell 200 may be controlled through a respective row decoder 206 and a respective column decoder 210. As mentioned above, in different embodiments, the controller 108, the command decoder 120, and/or the control blocks 132 may include the row decoder 206 and/or the column decoder 210. In some examples, the row decoder 206 may receive a row address from the command decoder 120 and may activate the appropriate word line 202 based on the received row address.

Similarly, a column decoder 210 may receive a column address from the command decoder 120 and may activate the appropriate digit line 204. The command decoder 120 may provide the row address and the column address based on receiving and decoding the access commands and providing the access instructions. For example, the memory bank 102 may include multiple word lines 202, labeled WL_1 through WL_M, and multiple digit lines 204, labeled DL_1 through DL_N, where M and N depend on the array size. Thus, by activating a word line 202 and a digit line 204, e.g., WL_2 and DL_3, the memory cell 200 at their intersection may be accessed.

In any case, upon accessing, the memory cell 200 may be read, or sensed, by sense component 208 to determine the stored state of the memory cell 200. For example, after accessing the memory cell 200, a ferroelectric capacitor of the memory cell 200 may discharge a first charge (e.g., a dielectric charge) onto its corresponding digit line 204. In other examples, after accessing the memory cell 200, the ferroelectric capacitor of the memory cell 200 may discharge a second or third charge (e.g., a polarization charge) onto its corresponding digit line 204. Discharging the ferroelectric capacitor may be based on biasing, or applying a voltage, to the ferroelectric capacitor.

The discharging may induce a change in the voltage of the digit line 204, which sense component 208 may compare to a reference voltage (not shown) in order to determine the stored state of the memory cell 200. For example, if the digit line 204 has a higher voltage than the reference voltage, then sense component 208 may determine that the stored state in the memory cell 200 is related to a first predefined memory state. In some cases, the first memory state may include a state 1, or may be another value—including other logic valves associated with multi-level sensing that enables storing more than two values (e.g., 3 states per cell or 1.5 bits per cell). The sense component 208 may include various transistors or amplifiers in order to detect and amplify a difference in the signals, which may be referred to as latching. The detected logic state of the memory cell 200 may then be output through column decoder 210 as output 212.

In some examples, detecting and amplifying a difference in the signals, may include latching a charge that is sensed in sense component 208. One example of this charge may include latching a dielectric charge associated with the memory cell 200. As an example, the sense component 208 may sense a dielectric charge associated with the memory cell 200. The sensed dielectric charge may be latched in a latch within the sense component 208 or a separate latch that is in electronic communication with the sense component 208.

FIG. 3 illustrate an embodiment of a truth table 300 of various combinations of command signals for column command operations for a memory device 100 with 7 CA bus pins CA[6:0] (e.g., generated for 7-pin command/address interface). As mentioned above, the processor of the computing system may transmit the access commands to the memory device 100, additionally or alternatively, any other viable processing circuitry may transmit the access commands to the memory device 100. For instance, the command decoder 120 in the memory device 100 may receive the combinations of command signals including a chip select (CS) signal and command address signals CAj (j=0, 1, 2, 3, 4, 5, 6) for the column commands.

In FIG. 3, "R1" and "F1" in a CK Edge field correspond to a rising edge and a falling edge of a single clock cycle of each command (number "1" means only one clock cycle is used for each access command), respectively. In the command truth table 300, a "V" bit represents unused valid (V) bit. A bit "X" represents a "Don't Care" signal, which means a signal (e.g., the chip select signal (CS)) represented by "X" can be floated. BA[5:0] represent bank addresses, BG[1:0] represent bank group addresses, R[15:0] represent row addresses (not shown in the illustrated truth table 300), and C[1:0] represent column addresses. An AP bit represents whether an auto-precharge (AP) occurs to a bank associated with a command including the AP bit. It should be noted that, the memory apparatus according to the present disclosure may typically include commands of predetermined clock cycles. Although a single clock cycle is used in the illustrated embodiment in FIG. 3, the number of clock cycles for commands may not be limited to single clock cycle.

Generally, the CS signal is active (e.g., "H") in the first clock cycle of a command using multiple clock cycles. The active CS signal indicates that a current clock cycle is the first clock cycle of the command. Once the command decoder detects the active CS signal, the command decoder may also receive a portion of the command at the first clock cycle and clock cycles after the first clock cycle of the clock signal. In the illustrated embodiment in FIG. 3, only one clock cycle is used, and each command has two portions corresponding to the rising edge (R1) and the falling edge (F1) of the single clock cycle, respectively. That is, in the illustrated embodiment, the CS signal is active (e.g., "H") in the first portion of each command, which is at the rising edge of the single clock cycle (i.e., the CK Edge field corresponds to "R1"). In the illustrated embodiment in FIG. 3, since each command has only two portions, the value of the CS signal for the second portion of each command, which is at the falling edge of the single clock cycle (i.e., the CK Edge field corresponds to "F1"), can be any value (e.g. either "H" or "L") and thus is indicated by "X". In the illustrated embodiment in FIG. 3, the active CS signal indicates that the command decoder continues to receive the remaining portion after the first portion of the command (e.g., the second portion) at the falling edge of the single clock signal. In this manner, the command can be completely received by the memory device in one clock cycle.

In the illustrated embodiment in FIG. 3, the first portion of the command may include a header (e.g., CA[3:0] for WR32, CA[2:0] for all other commands) having a unique combination (command code) of logic values (e.g., "H", "L") for identifying a command type (e.g., "READ", "WRITE", "MASK WRITE", etc.). For example, a "READ" (RD16) command for a read operation of data from a memory cell may include a command code having a combination of CA0 to CA2 as "HLL", a "WR32" command for a write operation of data to a memory cell may include a command code which is a combination of CA0 to CA3 as "LLHL". A "MWR" command for a masked write operation, which may include an operation of masking data so as to suppress and/or prevent the data in a write operation from being written to some of the memory cell blocks that constitute a memory cell array, may include a combination of CA0 to CA2 "LHL" as a command code.

It should be noted that, the truth table 300 of the column commands illustrated in FIG. 3 is only one embodiment, and other configurations (e.g., combinations of command signals) may be used for the truth table of the column commands. Accordingly, there may be less than two or more than two "V" bits in one column command, and the "V" bit(s) may be included in the first portion, or the second portion, or both portions of the column command. Moreover, although in the truth table 300 of the column commands illustrated in FIG. 3, all of the column commands have two "V" bits in the same CA pins (e.g., CA4 and CA5), in other embodiments, different column commands may have different number of "V" bits located in different CA pins.

Figures 4, 5A:
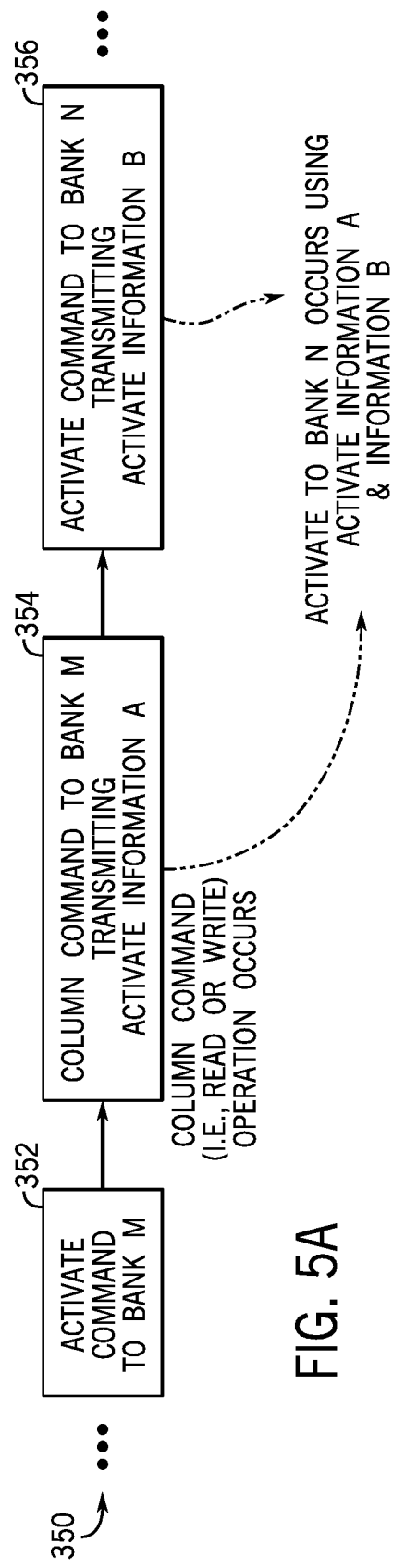
FIG. 4 is a truth table for activate commands for a memory device, according to an embodiment of the present disclosure.
FIG. 5A illustrates a flow diagram implementing activate information to activate a memory bank, according to an embodiment of the present disclosure.

Memory cells may be activated before corresponding operations (e.g., read or write) can be enabled. Accordingly, activate (ACT) commands are used for activating a memory bank and a row of the memory bank. FIG. 4 illustrate a truth table 320 of ACT commands ("ACT-1" and "ACT-2") for a memory device with 7 CA bus pins CA[6:0] (e.g., generated for 7-pin command/address interface). As mentioned above, the processor of the computing system may transmit the access commands to the memory device 100, additionally or alternatively, any other viable processing circuitry may transmit the access commands to the memory device 100. Similar to the discussion for column commands in FIG. 3, the command decoder 120 in the memory device 100 may receive the combinations of command signals including a chip select (CS) signal and command address signals CAj (j=0, 1, 2, 3, 4, 5, 6) for the ACT commands.

In the illustrated embodiment in FIG. 4, the "ACT-1" Command is followed by the ACT-2 command. The ACT commands in FIG. 4 have similar combinations of command signals as those column commands in FIG. 3. For example, in the illustrated embodiment in FIG. 4, "R1" and "F1" in a CK Edge field correspond to a rising edge and a falling edge of a single clock cycle of each ACT command (number "1" means only one clock cycle is used for each activate command), respectively. Similarly, each ACT command has only two portions with the CS signal indicated active (e.g., "H") in the first portion, which is at the rising edge of the single clock cycle (i.e., the CK Edge field corresponds to "R1"). The value of the CS signal for the second portion of each ACT command, which is at the falling edge of the single clock cycle (i.e., the CK Edge field corresponds to "F1"), can be any value (e.g. either "H" or "L") and thus is indicated by "X". In the illustrated embodiment in FIG. 4, the active CS signal in the first portion of the ACT command indicates that the command decoder 120 continues to receive the remaining portion (e.g., the second portion) at the falling edge of the single clock signal after receiving the first portion of the ACT command. In this manner, the ACT command can be completely received by the memory device in one clock cycle. It should be noted that, although a single clock cycle is used in the illustrated embodiment in FIG. 4, the number of clock cycles for ACT commands may not be limited to a single clock cycle in other embodiments.

In the illustrated embodiment in FIG. 4, the first portion of the ACT command may include a header (e.g., CA[2:0]) having a unique combination (command code) of logic values (e.g., "H", "L") for identifying a command type (e.g., "ACT-1", "ACT-2"). For example, the "ACT-1" command to activate a first portion of the memory banks and rows in the memory banks may include a command code having a combination of CA0 to CA2 as "HHH", and the "ACT-2" command to activate a second portion of the memory banks and rows in the memory banks may include a command code having a combination of CA0 to CA2 as "HHL". In the illustrated embodiment in FIG. 4, there are 16 row address terms that reside on the "ACT-1" and "ACT-2" commands, accordingly, the number of pages that could be activated is $2^{16}$. For instance, in the illustrated embodiment in FIG. 4, the "ACT-1" command transmits row addresses R[15:12] using CA[6:3] in the first portion (at the rising edge of the single clock cycle) and row address R11 using CA4 in the second portion (at the falling edge of the single clock cycle). The "ACT-1" command transmits bank addresses BA[1:0] using CA[1:0], BA2 using CA6, BA3 using CA5, BA[5:4] using CA[3:2] (or bank group addresses BG[1:0] using CA[3:2] for BG mode) in the second portion. The "ACT-2" command transmit row addresses R[10:7] using CA[6:3] in the first portion (at the rising edge of the single clock cycle) and row addresses R[6:0] using CA[6:0] in the second portion (at the falling edge of the single clock cycle).

As mentioned above, to reduce power associated with activation, page sizes may be decreased, which may result in greater row address terms and less column terms. Further, increased density may require more row address terms. Moreover, to provide flexibility to the controller, a dynamic page size activation feature may be provided allowing multiple page sizes (e.g., 64 B or 128 B) to be activated, which may require extra activate information. Additional row address and dynamic page size information should be transmitted with the activate (ACT) commands. To avoid modifying the ACT commands (e.g., the CA bus pins or the number of clock cycles in each ACT command), the additional activate information may be transmitted using the unused valid "V" bits in a preceding column command (e.g., "WRITE", "WRITE 32", "MASK WRITE", "READ", "READ32", etc.), in accordance with embodiments of the present invention. That is, an unused valid "V" bit in a column command may be used to transmit additional information, such as row addresses, bank addresses, bank group addresses, other activate information, etc. The additional information may be used by an ACT command following the corresponding column command to transmit additional activate information to the memory device. That is, in accordance with the present embodiments, the column command may be used for two purposes: to perform column command operation (e.g., read or write) and to transmit additional activate information for a subsequent activate command (ACT), as illustrated in FIGS. 5A and 5B.

FIG. 5A illustrates a flow diagram 350 of an embodiment using additional activate information transmitted in a preceding column command to activate a memory bank. At block 352, activate to a memory bank M occurs by performing the activate commands. At block 354, the column command may perform a column command operation (i.e., read or write) to the memory bank M. In addition, the column command at block 354 may transmit additional activate information (activate information A) regarding a memory bank N that will be activated in the subsequent activate command at block 356. At block 356, the activate commands transmit activate information (activate information B) of the memory bank N, and the activate command to the memory bank N occurs using both the activate information A and the activate information B. Since the memory bank N is activated at block 356, the activate information A of the memory bank N transmitted by the column command to the memory bank at block 354 is not used (e.g., may be saved in a buffer in the command decoder 120 or the control blocks 132 for later use) until the activate information B to the memory bank N is transmitted by the activate command at block 356. That is, the activate command to memory bank N at block 356 only transmits part of the activate information needed (i.e., the activate information B) to activate the memory bank N, and the other part of the activate information needed (i.e., the activate information A) to activate the memory bank N is transmitted by the preceding column command to the memory bank M at block 354. As discussed above, the additional activate information may be transmitted using the unused valid "V" bits in a preceding column command (e.g., "READ", "WRITE", "MASK WRITE", etc.), accordingly, the activate information A may be transmitted by using the unused valid "V" bits in the column command to the memory bank M at block 354. It should be noted that any column command to the memory bank M having one or more "V" bits may be used to transmit the activate information A at block 354. It should also be noted that, although a single clock cycle is used in the column commands and the ACT commands in the embodiments illustrated in FIG. 3 and FIG. 4, multiple clock cycles (e.g., second clock cycle, third clock cycle, fourth clock cycle, etc.) may be used for the column commands, or the ACT commands, or both in other embodiments.

Figure 5B:
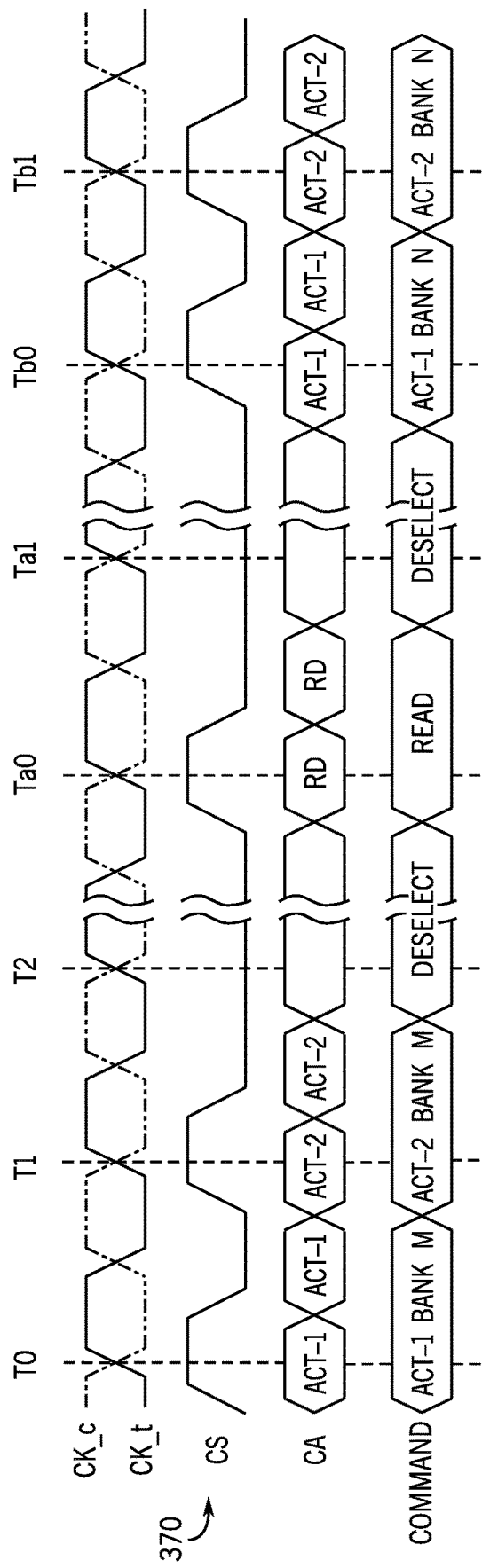
FIG. 5B illustrates a timing diagram implementing activate information to activate a memory bank, according to an embodiment of the present disclosure.

FIG. 5B illustrates a timing diagram 370 of an embodiment using activate information from a preceding column command to activate a memory bank. Two clock signals are used in the timing diagram 370, a true clock signal (CK_t) and a complementary clock signal (CK_c). CK Edge used in the truth table 300 in FIG. 3 and the truth table 320 in FIG. 4 corresponds to the true clock signal (CK_t).

At time T0, CS is active ("H") and the clock signal CK_t is at a rising edge (R1), according to the truth table 320 in FIG. 4, the first portion of the activate command "ACT-1" to a memory bank M transmits the header having the command code (e.g., "HHH") and part of the activate information (e.g., R[15:12]) to the memory bank M. At a falling edge (F1) of the clock signal CK_t after time T0 and before time T1, the second portion of the activate command "ACT-1" to the memory bank M transmits the other part of the activate information (e.g., BA[5:0], BG[1:0], R11). At time T1, CS is active ("H") indicating the beginning of the activate command "ACT-2", and the first portion of the activate command "ACT-2" to a memory bank M transmits the header having the command code (e.g., "HHL") and part of the activate information (e.g., R[10:7]). At a falling edge (F1) of the clock signal CK_t after time T1 and before time T2, the second portion of the activate command "ACT-2" to the memory bank M transmits the other part of the activate information (e.g., R[6:0]). At T2, a "DESELECT" command indicates that any number of events or operations may occur, e.g., any number of other commands may be issued during this time.

At time Ta0, CS is active ("H") and the clock signal CK_t is at a rising edge (R1), according to the truth table 300 in FIG. 3, the first portion of the read command "READ" to a memory bank M transmits the header having the command code (e.g., "HLL") and part of the addresses (e.g., BA3, C0) for the read operations to the memory bank M. That is, the read operation occurs at time Ta0. At a falling edge (F1) of the clock signal CK_t after time Ta0 and before time Ta1, the second portion of the read command "READ" to the memory bank M transmits the other part of the addresses (e.g., BA3, C0) for the read operations to the memory bank M (e.g., for mode BG: BA[2:0], BG[1:0], C1, AP; for mode 64 B: BA[5:0], C1, AP). At time Ta1, a "DESELECT" command indicates that any number of events or operations may occur, e.g., any number of other commands may be issued during this time. As discussed above, the "READ" command also transmits the activate information A (e.g., row addresses, bank addresses, bank group addresses, etc.) to a memory bank N using the available unused valid "V" bits (e.g., at CA[5:4] in the first portion of the read command). It should be noted that, although read command "READ" is used in the illustrated embodiment in FIG. 5B, other column commands (e.g., "WRITE", "WRITE 32", "MASK WRITE", "READ32", etc.) may be used to transmit activate information A to the memory bank N.

At time Tb0, CS is active ("H") and the clock signal CK_t is at a rising edge (R1), according to the truth table 320 in FIG. 4, the first portion of the activate command "ACT-1" to a memory bank N transmits the header having the command code (e.g., "HHH") and part of the activate information (e.g., R[15:12]) to the memory bank N. At a falling edge (F1) of the clock signal CK_t after time Tb0 and before time Tb1, the second portion of the activate command "ACT-1" to the memory bank N transmits the other part of the activate information (e.g., BA[5:0], BG[1:0], R11). At time TB1, CS is active ("H") indicating the beginning of the activate command "ACT-2", and the first portion of the activate command "ACT-2" to a memory bank N transmits the header having the command code (e.g., "HHL") and part of the activate information (e.g., R[10:7]). At a falling edge (F1) of the clock signal CK_t after time Tb1 and before time Tb2 (Tb2 is not shown in FIG. 5B), the second portion of the activate command "ACT-2" to the memory bank N transmits the other part of the activate information (e.g., R[6:0]). That is the activate commands "ACT-1" and "ACT-2" transmit the activate information B to the memory bank N. The activate to the memory bank N occurs using both the activate information A, transmitted by the read command "READ" during the time period Ta0 to Ta1, and the activate information B, transmitted by the activate commands "ACT-1" and "ACT-2" during the time Tb0 to Tb2 (Tb2 is not shown in FIG. 5B).

For example, in the illustrated embodiment in FIG. 5B, there are 16 row address terms that reside on the "ACT-1" and "ACT-2" commands, accordingly, the number of pages that could be activated is $2^{16}$ based on the truth table 320 in FIG. 4. The unused valid (V) bits in the read command "READ" (e.g., two "V" bits in the read command "READ" in the truth table 300 in FIG. 3) in FIG. 5B may be used to transmit additional activate information, e.g., two additional row addresses (e.g., R16 and R17). Accordingly, in the illustrated embodiment, now there are total 18 row address terms that reside on the previous column command, the "ACT-1" command, and the "ACT-2" command, and the number of pages that could be activated increases to $2^{18}$ without increasing the tRCD (i.e., minimum number of clock cycles required to issue a READ or WRITE command after the ACT command) time. It should be noted that the unused valid (V) bits in the column command (e.g., "READ") may be used to transmit additional activate information other than row addresses, such as bank addresses, bank group addresses, and other activate information. It should also be noted that the unused valid (V) bits in a same column command may be used to transmit different types of activate information. For example, in the illustrated embodiment above, one of the two unused valid (V) bits may be used to transmit a PS0 bit for dynamic page size activation, and the other unused valid (V) bit may be used to transmit a row address (e.g., R16).

The illustrated embodiment above provides dynamic page size activation and, at the same time, maintains or increases system performance (e.g., maintaining a two cycle activate sequence "ACT-1" and "ACT-2" each with single clock cycle). For example, in the illustrated embodiment above, the PS0 bit having a first value (e.g., low) may indicate that a smaller page size (smaller page includes less columns) is activated, and the PS0 bit having a second value (e.g., high) may indicate that a bigger page size (bigger page includes more columns) is activated. When the density of the memory device remains the same, additional row address terms are needed for smaller page size, and less row address terms are needed for bigger page size. Therefore, the present disclosure provides a cost efficient method and technology to provide a compatible interface to incorporate with the emerging memory devices. Moreover, the illustrated embodiment above also optimizes command address table utilization by utilizing the unused column command bits (e.g., "V" bit). Thereby, the current disclosure allows existing memory devices with 7 pin CA interfaces to be used on future higher density parts, which adds more likelihood of market acceptance of emerging memory technology and, at the same time, utilizes already developed 7 pin CA support.

It should be appreciated that, although a column command is used to transmit additional activate information in the illustrated embodiment above, any other previous command (e.g. a PRE (PRECHARGE PER BANK) command) having an unused valid (V) bit may be used to transmit additional activate information for a subsequent activate command (ACT).

Figure 6A:
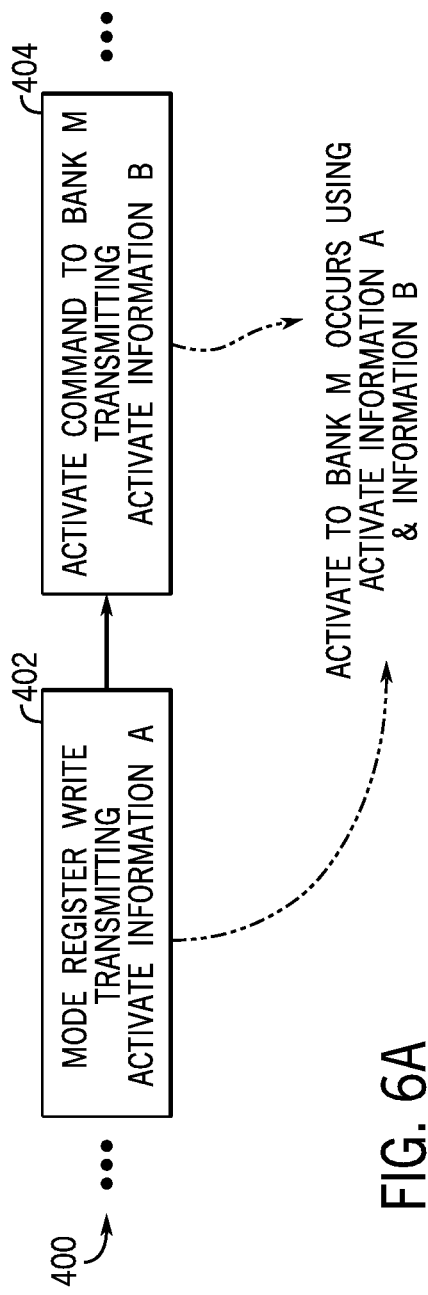
FIG. 6A illustrates a flow diagram of initializing activate information, according to an embodiment of the present disclosure.
Figure 6B:
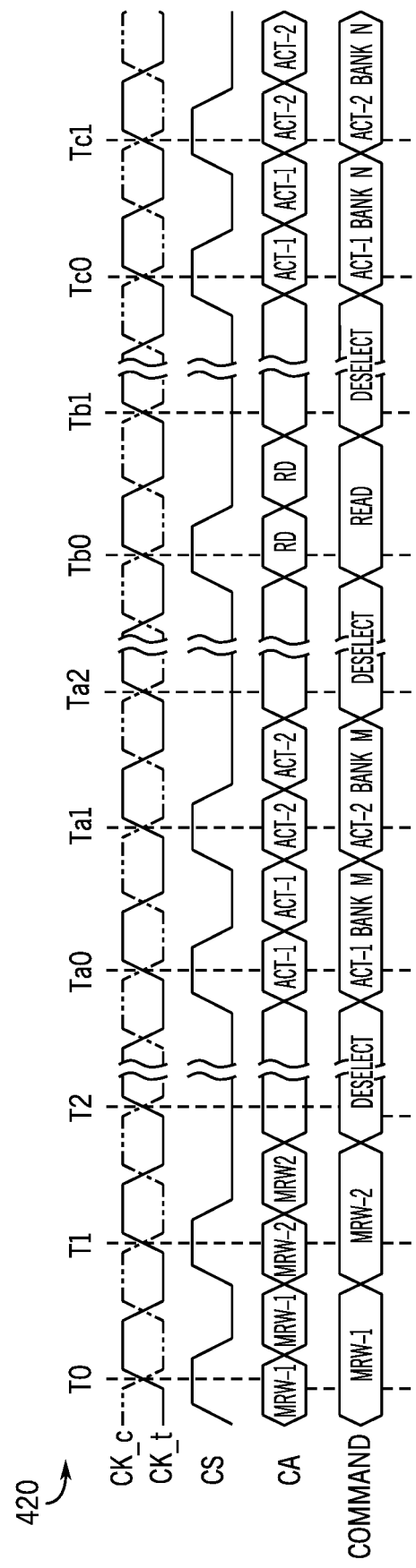
FIG. 6B illustrates a timing diagram of initializing activate information, according to an embodiment of the present disclosure.
Figure 7A:
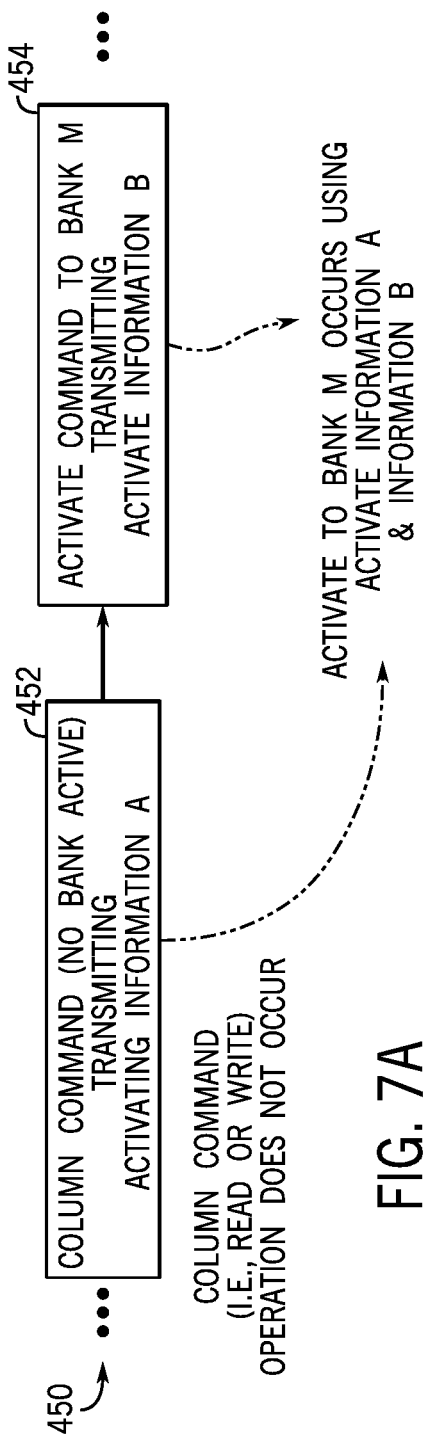
FIG. 7A illustrates a flow diagram of a second embodiment of initializing activate information, according to an embodiment of the present disclosure.
Figure 7B:
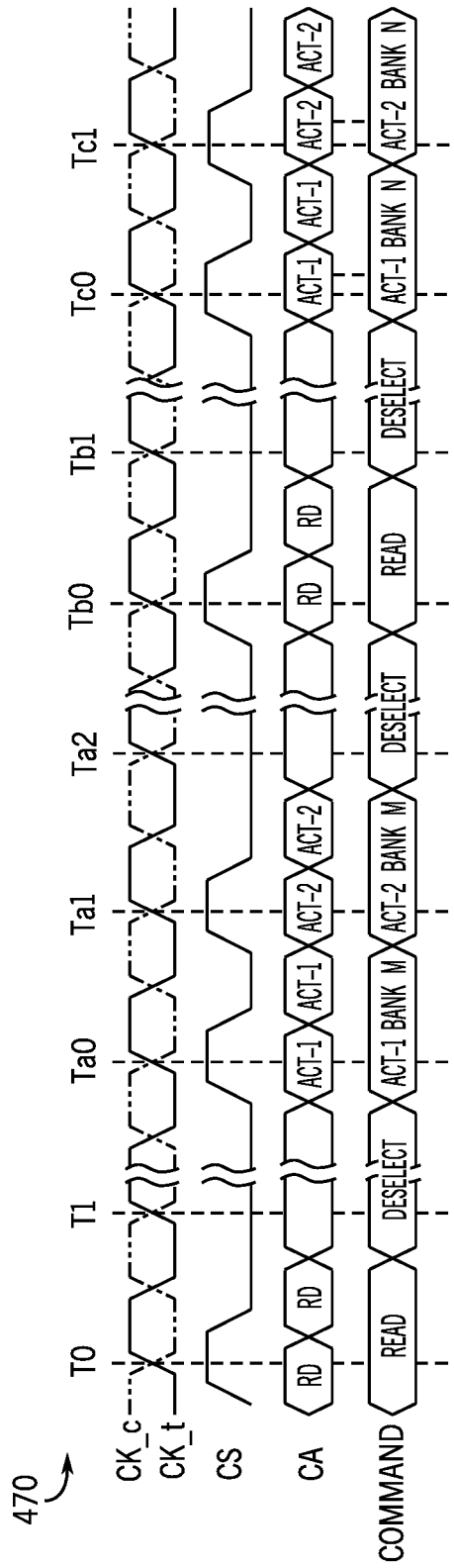
FIG. 7B illustrates a timing diagram of a second embodiment of initializing activate information, according to an embodiment of the present disclosure.

Any activate command following the first initial activate will have a preceding command, in which additional activate information (activate information A) may be communicated. Accordingly, the first initial activate command may require an initialization procedure to set the additional activate information. A mode register write could be issued to transmit the initial additional activate information, as illustrated in FIG. 6A and FIG. 6B. Alternatively or additionally, a dummy column command (i.e., no bank is active and thus no bank operation occurs) could be issued to transmit the initial additional activate information, as illustrated in FIG. 7A and FIG. 7B. In addition, the last updated additional activate information has priority, whether that be communicated by column commands or by mode register write.

FIG. 6A illustrates a flow diagram 400 of an embodiment of initializing activate information for initial activate using a mode register write command ("MRW"). As discussed above in FIG. 1, the one or more registers 128 may provide and/or define configuration information to define operations of the memory device 100. At block 402, a mode register write command may transmit initial activate information A regarding a memory bank M (e.g., via the bus path 133 to the control block 132 of the memory bank M). At block 404, the activate command to the memory bank M may transmit the activate information (activate information B) regarding the memory bank M, and the activate to the memory bank M occurs using both the activate information A and the activate information B. Since the memory bank M is activated at block 404, the initial activate information A of the memory bank M transmitted by the mode register write command at block 402 is not used (e.g., may be saved in the control block 132 of the memory bank M) until the activate information B to the memory bank M is transmitted by the activate command at block 404. That is, the activate command to memory bank M at block 404 only transmits part of the activate information needed (i.e., the activate information B) to activate the memory bank M, and the other part of the activate information needed (i.e., the activate information A) to activate the memory bank M is transmitted by the mode register write command at block 402.

FIG. 6B illustrates a timing diagram 420 of an embodiment using the mode register write command to transmit initial additional activate information. In FIG. 6B, mode register write commands "MRW-1" and "MRW-2" are used before the first initial activate command to transmit the initial additional activate information. For example, at time T0, a mode register write command "MRW-1" may select one of the one or more registers 128 to transmit the initial additional activate information. At time T1, a mode register write command "MRW-2" may transmit the initial additional activate information A regarding the memory bank M to the register selected by the preceding mode register write command "MRW-1". The selected register may output the initial additional activate information A to the control block 132 of the memory bank M. At T2, a "DESELECT" command indicates that any number of events or operations may occur, e.g., any number of other commands may be issued during this time. Then at time Ta0 and Ta1, the first initial activate commands "ACT-1" and "ACT-2" transmit activate information B regarding the memory bank M to the control block 132 of the memory bank M. The activate to the memory bank M occurs by using the initial additional activate information A, transmitted by the mode register write command "MRW-2" at time T1, and the activate information B, transmitted by the initial activate commands "ACT-1" and "ACT-2" at time Ta0 and Ta1. Any activate command following the first initial activate (e.g., "ACT-1"

and "ACT-2" at time Tc0 and Tc1 in FIG. 6B) will have a preceding column command (e.g., the read command "READ" in FIG. 6B), in which additional activate information (activate information A) may be communicated.

FIG. 7A illustrates a flow diagram 450 of an embodiment of initializing activate information for initial activate using a dummy column command (i.e., no bank is active and thus no bank operation occurs). Emerging memory device specifications and logic may be modified to allow a dummy column command to be issued to transmit the initial activate information A. At block 452, the dummy column command may transmit initial activate information A regarding a memory bank M. At block 454, the activate command to the memory bank M may transmit the activate information (activate information B) regarding the memory bank M, and the activate to the memory bank M occurs using both the activate information A and the activate information B. Since the memory bank M is activated at block 454, the initial activate information A of the memory bank N transmitted by the dummy column command at block 452 is not used (e.g., may be saved in a buffer in the command decoder 120 or the control blocks 132 of the memory bank M for later use) until the activate information B is transmitted by the activate command to the memory bank M at block 454. That is, the activate command to memory bank M at block 454 only transmits part of the activate information needed (i.e., the activate information B) to activate the memory bank M, and the other part of the activate information needed (i.e., the activate information A) to activate the memory bank M is transmitted by the dummy column command at block 452.

FIG. 7B illustrates a timing diagram 470 of an embodiment using a dummy column command to transmit initial additional activate information. In FIG. 7B, a dummy column command is used before the first initial activate command to transmit the initial additional activate information. For example, at time T0, the dummy column command "READ" (i.e., no bank is active and thus no read operation occurs) transmits initial additional activate information A regarding a memory bank M (e.g., may be saved in a buffer in the command decoder 120 or the control blocks 132 of the memory bank M for later use). At T1, a "DESELECT" command indicates that any number of events or operations may occur, e.g., any number of other commands may be issued during this time. Then at time Ta0 and Ta1, the first initial activate commands "ACT-1" and "ACT-2" transmit activate information B regarding the memory bank M. The activate to the memory bank M occurs by using the initial additional activate information A, transmitted by the dummy column command "READ" at time T0, and the activate information B, transmitted by the initial activate commands "ACT-1" and "ACT-2" at time Ta0 and Ta1. Any activate command following the first initial activate (e.g., "ACT-1" and "ACT-2" at time Tc0 and Tc1 in FIG. 7B) will have a preceding column command (e.g., the read command "READ" at time Tb0 in FIG. 7B), in which additional activate information (activate information A) may be communicated. It should be noted that, although the read command "READ" is used in the embodiment illustrated in FIG. 7B for initializing additional activate information at time T0, other column commands (e.g., "WRITE", "WRITE 32", "MASK WRITE", "READ32", etc.) may be used for initializing activate information. It should also be appreciated that, although column command is used for initializing additional activate information in the illustrated embodiment above, any other command having an additional unused valid (V) bit may be used for initializing additional activate information for a subsequent activate command (ACT).

Figure 8:
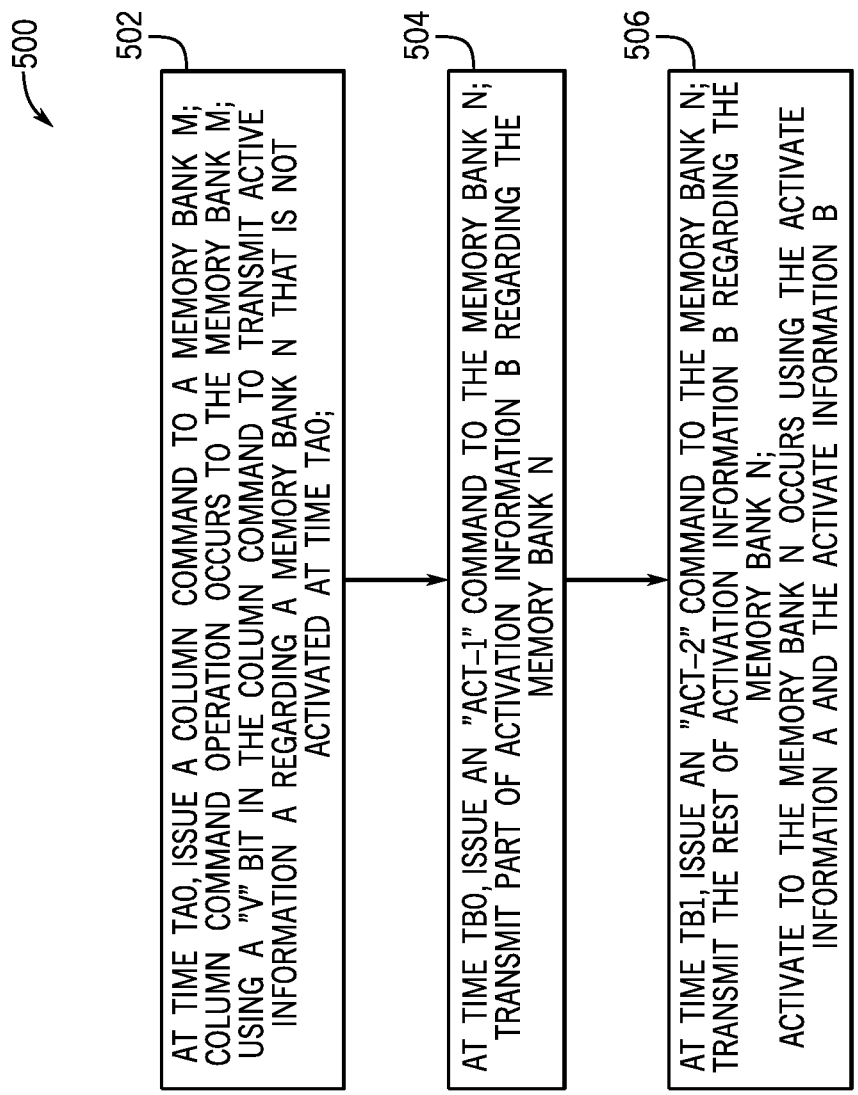
FIG. 8 illustrates a flow diagram of a method to transmit additional activate information, according to an embodiment of the present disclosure.

FIG. 8 illustrates a flow diagram of a method 500 for implementing a preceding column command to transmit additional activate information regarding a memory bank. At block 502, a column command (e.g., a read command "READ") is issued at time Ta0 to a memory bank M that has been activated. As discussed above, the column command may transmit the additional activate information A (e.g., row addresses, bank addresses, bank group addresses, etc.) regarding a memory bank N, which is not activated at time Ta0, using the available "V" bits in the column command (e.g., CA[5:4] in the first portion of the column commands in the truth table 300 in FIG. 3). The operation of the column command (e.g., read operation of the read command "READ") occurs to the memory bank M at time Ta0.

At block 504, an activate command "ACT-1" to the memory bank N is issued at time Tb0 and transmits part of the activate information B (e.g., R[15:11], BA[5:0], BG[1:0], as illustrated in the truth table 320 in FIG. 4) to the memory bank N. At block 506, an activate command "ACT-2" to the memory bank N is issued at time Tb1 and transmits the rest of the activate information B (e.g., R[10:0] as illustrated in the truth table 320 in FIG. 4) to the memory bank N. That is the activate commands "ACT-1" and "ACT-2" transmit the activate information B to the memory bank N. The activate to the memory bank N occurs at time Tb1 using both the activate information A and the activate information B. It should be appreciated that, although column command is used to transmit additional activate information in the illustrated embodiment above, any other previous command having an additional unused valid (V) bit may be used to transmit additional activate information for a subsequent activate command (ACT).

Accordingly, the technical effects of the present disclosure include a method and a system related to utilizing unused valid (V) bits residing on a previous command to transmit additional activate information to a memory device for a subsequent activate command (ACT). Additional activate information may be transmitted to the memory device without increasing the tRCD (i.e., minimum number of clock cycles required to issue a READ or WRITE command after the ACT command) time, or increasing the command/address (CA) bus pins, or adding additional circuit area, thereby reducing the impact on the performance of the memory device.

In the illustrated embodiments above (e.g., FIG. 3 and FIG. 4), a 7-pin CA interface is used to describe the access commands (e.g., "ACT-1", "ACT-2", "READ", "WRITE", etc.). However, it should be understood that the invention is not intended to be limited to the particular forms disclosed, e.g., other command interface with different number of CA pins may also be used (e.g., 9-pin CA interface), and/or the access commands (e.g., "ACT-1", "ACT-2", "READ", "WRITE", etc.) may have different specifications.

In the illustrated embodiments above, the memory devices and systems are primarily described in the context of devices incorporating DRAM storage media. Memory devices configured in accordance with other embodiments of the present technology, however, may include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
   command decoder circuitry configured to:
      receive a command for performing an operation to a first memory bank at a first clock cycle, wherein the command comprises a first portion of activate information regarding a second memory bank;
      receive an activate command for activating the second memory bank at a second clock cycle, wherein the activate command comprises a second portion of the activate information regarding the second memory bank; and
      activate the second memory bank using the first portion and the second portion of the activate information regarding the second memory bank at the second clock cycle; and
   processing circuitry configured to generate the command, wherein the processing circuitry is communicatively coupled to the command decoder circuitry.

2. The device of claim 1, wherein the command comprises a column command.

3. The device of claim 2, wherein the column command comprises a read command or a write command.

4. The device of claim 1, wherein the command comprises an unused valid bit and the first portion of the activate information is transmitted by using the unused valid bit.

5. The device of claim 1, wherein the first portion of the activate information is different from the second portion of the activate information.

6. The device of claim 1, wherein the operation to the first memory bank does not occur at the first clock cycle.

7. The device of claim 1, wherein the operation to the first memory bank occurs at the first clock cycle.

8. The device of claim 1, wherein the command is generated corresponding to a 7 pin command address bus interface.

9. A method comprising:
   receiving, by command decoder circuitry of a memory device, a command for performing an operation to a first memory bank at a first clock cycle, wherein the command comprises a first portion of activate information regarding a second memory bank;
   receiving, by the command decoder circuitry of the memory device, an activate command for activating the second memory bank at a second clock cycle, wherein the activate command comprises a second portion of the activate information regarding the second memory bank; and
   activating the second memory bank, by the command decoder circuitry of the memory device, using the first portion and the second portion of the activate information regarding the second memory bank at the second clock cycle.

10. The method of claim 9, wherein the command comprises a column command.

11. The method of claim 10, wherein the column command comprises a read command or a write command.

12. The method of claim 9, wherein the first portion of the activate information is transmitted by using an unused valid bit in the command.

13. The method of claim 9, wherein the first portion of the activate information is different from the second portion of the activate information.

14. The method of claim 9, wherein the operation to the first memory bank does not occur at the first clock cycle.

15. The method of claim 9, wherein the operation to the first memory bank occurs at the first clock cycle.

16. The method of claim 9, wherein the command is generated corresponding to a 7 pin command address bus.

17. A method comprising:
   receiving, by a mode register, a first command at a first clock cycle, wherein the first command is configured to transmit a first portion of activate information regarding a first memory bank of a memory device;
   receiving, by command decoder circuitry of the memory device, a first activate command for activating the first memory bank at a second clock cycle, wherein the first activate command comprises a second portion of the activate information regarding the first memory bank;
   activating the first memory bank using the first portion and the second portion of the activate information regarding the first memory bank at the second clock cycle;
   receiving, by the command decoder circuitry of the memory device, a second command for performing an operation to the first memory bank at a third clock cycle, wherein the second command comprises a first portion of activate information regarding a second memory bank;
   receiving, by the command decoder circuitry of the memory device, a second activate command for activating the second memory bank at a fourth clock cycle, wherein the second activate command comprises a second portion of the activate information regarding the second memory bank; and
   activating the second memory bank using the first portion and the second portion of the activate information regarding the second memory bank at the fourth clock cycle.

18. The method of claim 17, wherein the first command comprises a mode register write command.

19. The method of claim 17, wherein the second command comprises a column command.

20. The method of claim 17, wherein the first portion of the activate information regarding the first memory bank is different from the second portion of the activate information regarding the first memory bank.

21. The method of claim 17, wherein the first portion of the activate information regarding the second memory bank is different from the second portion of the activate information regarding the second memory bank.

* * * * *